United States Patent [19]
Chan et al.

[11] Patent Number: 6,156,643
[45] Date of Patent: Dec. 5, 2000

[54] METHOD OF FORMING A DUAL DAMASCENE TRENCH AND BORDERLESS VIA STRUCTURE

[75] Inventors: Simon S. Chan, Saratoga; Fei Wang; Todd Lukanc, both of San Jose, all of Calif.

[73] Assignee: Advanced Micro Devices, Inc., Sunnyvale, Calif.

[21] Appl. No.: 09/187,430

[22] Filed: Nov. 6, 1998

[51] Int. Cl.$^7$ ............................................. H01L 21/32
[52] U.S. Cl. ................................. 438/638; 438/703
[58] Field of Search ..................................... 438/314, 315, 438/316, 317, 622, 634, 636, 637, 638, 692, 694, 126, 703; 430/311, 312, 314, 316, 317

[56] References Cited

U.S. PATENT DOCUMENTS

| | | | |
|---|---|---|---|
| 5,741,626 | 4/1998 | Jain et al. ................................ | 430/314 |
| 5,795,823 | 8/1998 | Avanzino et al. ....................... | 438/639 |
| 5,935,762 | 8/1999 | Dai et al. ................................. | 430/312 |
| 6,001,733 | 12/1999 | Huang et al. ........................... | 438/633 |
| 6,004,883 | 12/1999 | Yu et al. .................................. | 438/706 |

*Primary Examiner*—Mary Wilczewski
*Assistant Examiner*—David Goodwin

[57] ABSTRACT

A method of forming a dual damascene structure in a semiconductor device first etches a trench pattern into a hard mask layer, followed by the etching of a via pattern in the hard mask layer. The trench is widened to completely coincide with the via pattern if the via pattern does not fall completely within the trench pattern due to alignment errors. A dielectric material is then etched in accordance with the via pattern to a predetermined depth. The dielectric material is then further etched in accordance with the via pattern and the trench pattern that has been widened to completely overlap the via. Since the via has been etched into the dielectric material with its intended size, there is no increase in via resistance and good barrier metal step coverage and substantially void-free conductor filling are provided.

21 Claims, 3 Drawing Sheets

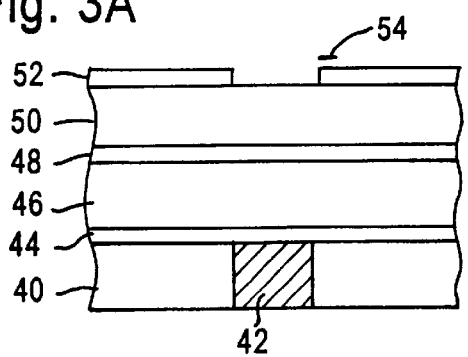
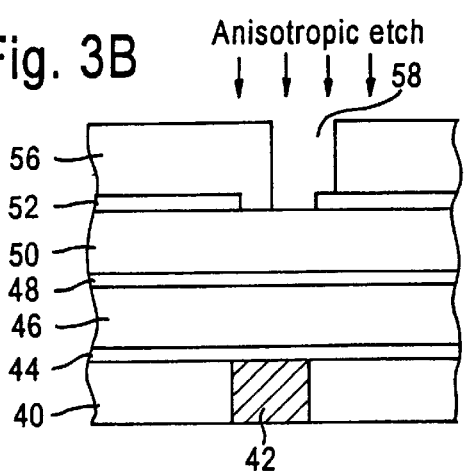
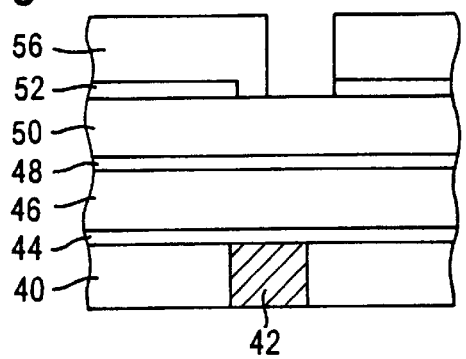
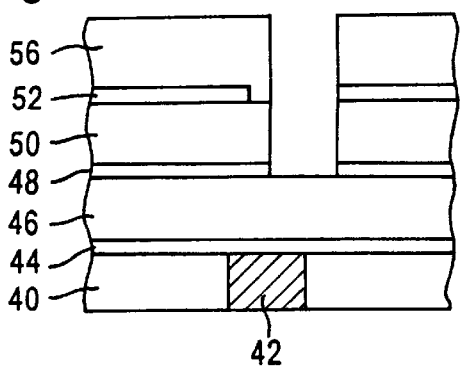
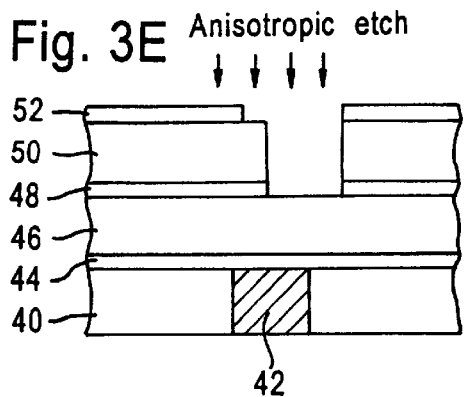
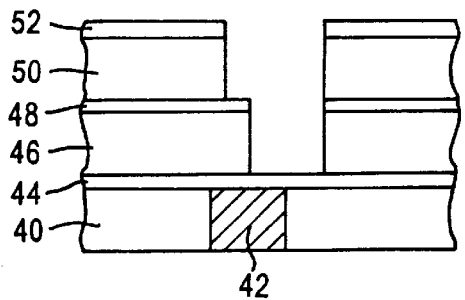
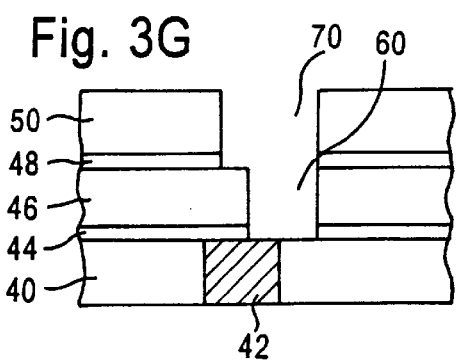
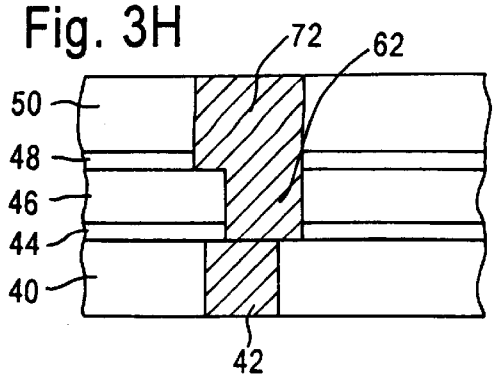

and so on.

METHOD OF FORMING A DUAL DAMASCENE TRENCH AND BORDERLESS VIA STRUCTURE

FIELD OF THE INVENTION

The present invention relates to the field of interconnects in semiconductor devices, and more particularly, to methods for forming dual damascene structures in which the trenches completely overlap the underlying borderless vias despite overlay errors between trench and via alignment.

BACKGROUND OF THE INVENTION

Integrated circuit fabrication typically begins with a thin, polished slice of high-purity, single crystal semiconductor material, usually silicon. Junctions (which make up devices) are formed between field oxide portions of the semiconductor slice. Metal lines and conductor layers provide necessary electrical connections between the devices. Dielectric (i.e. insulating) layers are formed between the conductor layers to isolate the metal lines from each other. Vias provide conducting paths through the dielectric layers to connect the interconnects of different conductor layers.

As micro-miniaturization of integrated circuits has increased, the smaller features have presented challenges to the semiconductor fabrication engineer. For example, the vias for connecting the interconnects are normally to be fully landed on the underlying structure. However, allowing only fully landed openings on increasingly narrow metal features results in extremely small contact or via holes. This in turn can result in very difficult via lithography and increased contact or interface resistance between all of the overlying metal structure and the underlying interconnect structure due to the decreased contact area. Borderless vias, which are not required to fully land on the underlying structure, have therefore found acceptance in the semiconductor industry due to their larger size and decreased resistance.

In high performance integrated circuits in the sub-0.25 $\mu$m regime, there is a need to fabricate interconnects using so-called damascene techniques. This is because conventional deposition and etching of aluminum-based metallization becomes increasingly difficult at these feature sizes. At the same time, performance considerations call for the use of lower resistivity metals such as copper, which has proven extremely difficult to pattern using conventional reactive ion etching. The desire to use copper for interconnects has increased the attractiveness of damascene techniques and spurred investigation into improving these techniques.

In single damascene techniques, via holes are etched in a dielectric, such as silicon dioxide, which has been deposited over a pre-existing layer of interconnects or active devices in order to make contact at the appropriate locations. The via holes are subsequently lined with an appropriate barrier metal and then filled with a low resistivity conductor, such as copper. Chemical-mechanical polishing (CMP) is, then employed to level the metal surface until it is of the same height as the surface of the dielectric to form embedded conducting metal studs. A second layer of dielectric is then deposited over this layer of studs. Trenches corresponding to the interconnect pattern are etched through the second layer of dielectric at appropriate locations. Metal deposition (barrier metal and conductor) and CMP are repeated to form an interconnect pattern which is connected to the pre-existing lower layer of interconnects or active devices by the metal studs. A multi-level interconnect system can be constructed by alternately stacking layers of metal studs and metal lines formed separately.

In dual damascene techniques, trenches and underlying via holes are both etched in a dielectric first before metal deposition and CMP are carried out in order to reduce the total number of process steps. An example of a dual damascene process sequence producing trenches with underlying via holes is depicted in FIGS. 1A–1D. This commonly used method of forming the trenches together with the via holes employs etch stop layers and photoresist masks. A bottom stop layer 14, such as silicon nitride, has been deposited over an existing interconnect pattern formed in interconnect layer 10. The interconnect pattern may be formed from a conductor 12, such as copper. A dielectric layer 16 is then deposited on the bottom stop layer 14. Dielectric layer 16 may be made of silicon dioxide, for example. The via will be formed within this first dielectric layer 16.

An etch stop layer 18, made of silicon nitride or silicon oxynitride, for example, is deposited over the first dielectric layer 16. A via pattern 20 is etched into the etch stop layer 18 using conventional photolithography and appropriate anisotropic dry etching techniques. (These steps are not depicted in FIG. 1A; only the resultant via pattern 20 is depicted in FIG. 1A.) The photoresist used in the via patterning is removed by an oxygen ashing step, for example.

FIG. 1B depicts the structure of FIG. 1A after a second layer 22 of dielectric material (e.g. silicon dioxide) has been deposited on the etch stop layer 18 and through the via pattern opening 20. The trench pattern is then formed in a photoresist layer 24 which is aligned over the via pattern, using conventional photolithography. The structure is then exposed to anisotropic dry etching configured to selectively etch the material in the first and second dielectric layers 16 and 22, but not the middle and bottom stop layers 18 and 14, forming the structure indicated in FIG. 1C. The photoresist layer 24 is then removed and the structure is then exposed to another anisotropic dry etch which selectively etches the bottom stop layer 14 and middle stop layer 18, but does not attack any other layer or the preexisting conductor 12. In this way, a trench 26 and via 28 are formed, as depicted in FIG. 1D. An appropriate barrier layer metal and conductor can then be deposited in the trench and via openings 26, 28 to be followed by CMP to complete the formation of the dual damascene structure.

The processing sequence depicted in FIGS. 1A–D is adequate if a sufficient overlay margin between the trenches and the vias is designed in the process to guarantee that the via openings will never fall outside the trench openings with the expected amount of overlay error. However, beginning with the 0.25 $\mu$m generation of integrated circuits, the overlay accuracy of photolithography equipment becomes a significant fraction of the minimum feature size. As a result of circuit compactness considerations, situations where the overlap between the conductor lines and vias is smaller than the expected alignment accuracy must be allowed. These vias are described as "borderless" or "unlanded", and are allowed to "fall off" the lower and upper conductor lines due to the expected alignment limitations, to the extent that unintentional short circuits can still be avoided.

FIG. 2 depicts a dual damascene structure in which a borderless via has been misaligned during the dual damascene trench and via formation. In dual damascene processing sequences that use a buried stop layer, such as stop layer 18 in FIGS. 1A–1D, a via hole opening 30 etched in stop layer 18 that partially falls outside of trench opening 26 over it due to misalignment will result in a reduction in the final via size. This is due to the anisotropic etching of the dielectric material in the first and second dielectric layer 16, 22 being performed only in accordance with the trench opening in the photoresist layer 24. The area of the via opening 30 that does not fall within the trench opening due to misalignment will not be etched, resulting in a smaller-sized via 32. Since the final size of the via 32 has thus been reduced, the via resistance is increased. The reduction in the final via size also makes it more difficult to achieve good barrier metal step coverage and void-free conductor filing.

SUMMARY OF THE INVENTION

There is a need for a method of forming a dual damascene trench and via structure in which the final via size is not affected by misalignment between the trench and via patterns, even if the vias are borderless.

This and other needs are met by the present invention which provides a method of forming a dual damascene structure in a semiconductor device comprising the steps of etching a trench pattern in a mask layer that overlays a dielectric layer. Photoresist material is deposited on the mask layer. A via pattern is then patterned in the photoresist material with possibly a portion of the via pattern overlying the trench pattern etched in the mask layer. The mask layer is etched further in accordance with the via pattern. The dielectric layer is then initially etched to an approximate first predetermined depth through the mask layer in accordance with the via pattern in the photoresist material. Photoresist material on the mask layer is then removed. The dielectric layer is then etched in accordance with the pattern already etched in the mask layer to an approximate second predetermined depth. The dielectric layer initially etched to the approximate first predetermined depth is then further etched to an approximate third predetermined depth in accordance with the via pattern.

One of the advantages of first patterning the trench in the mask layer, followed by patterning the via pattern and etching the mask layer further in accordance with the via pattern, is that the via is guaranteed to have a full width, while still providing for a complete overlay of the trench on the via. In other words, in contrast to the prior art in which a misaligned via is narrowed while the trench maintains its initial width, the present invention causes the via to maintain its desired width, while the trench is widened to completely overlay the via.

In another aspect of the present invention, a method of forming a dual damascene structure in an arrangement having a dielectric layer and a mask layer formed over the dielectric is provided. A trench pattern is created in the mask layer, this trench pattern having a first width. A via pattern is aligned over the mask layer, with at least a portion of the via pattern overlapping the trench pattern. Any portion of the mask layer within the via pattern that does not overlap the trench pattern is removed. This widens the trench pattern to a second width that is greater than the first width in those cases where the via pattern does not completely overlap the trench pattern. The dielectric layer is then etched according to the via pattern to create a via opening with the first depth. The via opening in the dielectric layer is then etched further according to the via pattern to a second depth. Simultaneously, the dielectric layer is etched according to the trench pattern to a third depth.

With the present invention, a via will be formed that has a full width and will be completely covered by the overlying trench, although the via may be misaligned as a borderless via and not completely overlap the underlying conductor or other feature. Since the via is full sized, the via resistance will not be increased and it is easier to achieve good barrier metal step coverage and void free conductor filling in the via.

The foregoing and other features, aspects and advantages of the present invention will become apparent from the following detailed description of the present invention when taken in conjunction with the accompanied drawings.

BRIEF DESCRIPTION OF THE DRAWINGS

FIGS. 3A–3H depict cross-sectional views of the interconnect portion of a semiconductor wafer during a manufacturing process thereof to form a dual damascene structure with a trench and via formation in accordance with certain embodiments of the present invention.

DETAILED DESCRIPTION OF EXEMPLARY EMBODIMENTS

Figure 1A:
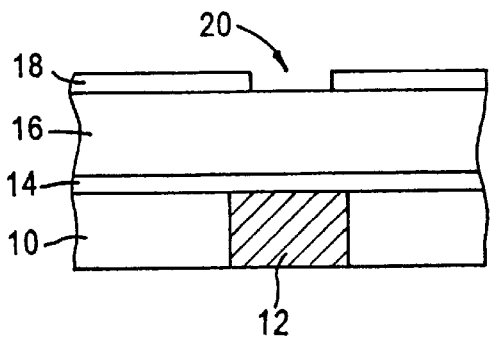
FIGS. 1A–D depict a method of forming a dual damascene trench and via structure in accordance with the prior art.
Figure 1B:
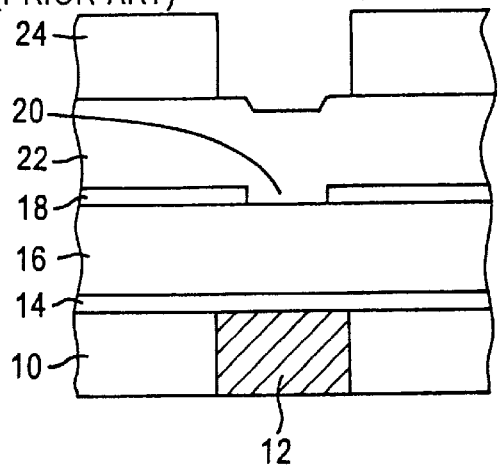
Figure 1C:
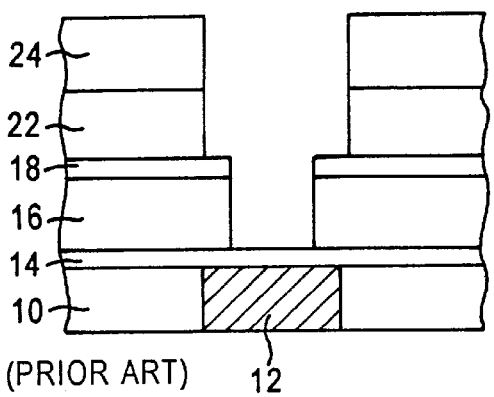
Figure 1D:
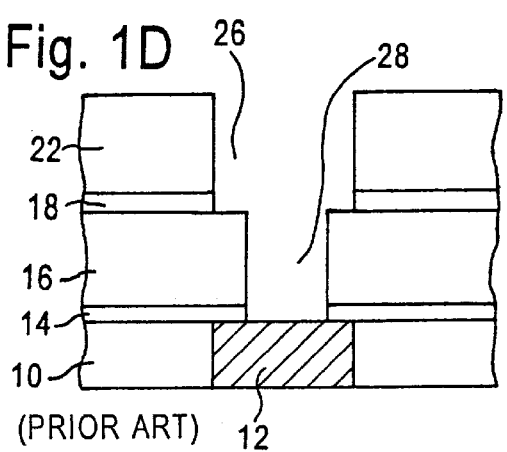

The present invention, with embodiments depicted in FIGS. 3A–H and 4A–H, provide a processing sequence for forming a dual damascene trench and via structure in which the final via size is not affected by misalignment between the trench and via patterns that could be borderless (i.e. expected to fall off with the anticipated misalignment). Furthermore, the embodiments of the present invention ensure there will always be full coverage of the top metal line with the underlying via after the barrier and conductor metal filling and chemical-mechanical polishing (CMP) are completed.

A first embodiment of the present invention is depicted in FIGS. 3A–H, showing a cross-section portion of a semiconductor wafer, for example. As shown in FIG. 3A, a conductor 42 having a few resistivity, such as copper, is provided in an interconnect layer 40. A bottom stop layer 44, made of silicon nitride, for example, is deposited on the interconnect layer and conductor 42. Bottom stop layer 44 protects conductor 42 during dry etching of the upper dielectric layers. A first dielectric layer 46 is then deposited on the bottom stop layer 44. The first dielectric layer 46 may be made of a suitable material, such as silicon dioxide. A middle stop layer 48 is then deposited on the first dielectric layer 46. In certain preferred embodiments, the first dielectric layer 46 is the layer in which the via will eventually be formed. The middle stop layer 48 may be made of silicon nitride or silicon oxynitride, for example.

After formation of the middle stop layer 48, the second dielectric layer 50 is deposited on the middle stop layer 48. This layer 50 may be made of the same material, silicon dioxide, as the first dielectric layer 46. In preferred embodiments of the present invention, the second dielectric layer 50 is the layer in which the trench is ultimately formed. One difference between the present invention and the conventional methods described in FIGS. 1A–1D is manifested at this stage. In conventional methods, the middle stop layer 48 has been etched to form the via pattern in it prior to the deposition of the second dielectric layer 50. By contrast, in the present invention, the middle stop layer 48 remains intact with the second dielectric layer 50 being deposited on its top surface.

A hard mask layer 52 is then deposited on the second dielectric layer 50. This hard mask layer 52 may be of silicon nitride or silicon oxynitride, for example. A photoresist material is then deposited over the hard mask layer 52 and patterned by using conventional photolithography to provide a trench pattern. This trench pattern is then etched in the hard mask layer 52 using a selective anisotropic dry etch without substantially etching the rest of the layers, to form a trench pattern 54 in the first mask layer 52. The photoresist is then removed by conventional ashing and/or solvents. The dielectric layer 50 will be substantially unaffected by the photoresist removal process since it is made of silicon dioxide, for example. This is in contrast to a dielectric layer made of low k dielectric material which may be consumed in conventional photoresist removal processes. The resulting structure after removal of the photoresist material is depicted in FIG. 3A.

After the trench pattern 54 has been formed in the hard mask layer 52, a new photoresist layer 56 for patterning the via is deposited over the hard mask layer 52 (as shown in FIG. 3B). The photoresist pattern for the via is defined to overlay the trench pattern. The via photoresist pattern may "fall off" the trench pattern due to an expected amount of misalignment that is allowed (as shown in FIG. 3B). The structure is then exposed to the same selective dry etch initially used for etching the hard mask layer 52. This ensures that any of the areas of the hard mask layer 52 exposed by the misalignment will be removed. The via size defined by the via photoresist opening 58 will be guaranteed and result in complete coverage of the final via structure by the overlying metal line as will be apparent from the later description. Hence, the original trench pattern is defined first within the hard mask layer 52, followed by further definition of the hard mask layer 52 to define the via opening. An exemplary etch chemistry to etch the hard mask layer 52, made of silicon nitride or silicon oxynitride, for example, is $CHF_3$ containing $O_2$. The trench opening is still defined in the hard mask layer 52, but it is now wider since it also covers any misaligned portion of the via. The structure following the removal of the portions of the hard mask layer 52 remaining within the via opening 58 is depicted in FIG. 3C.

The etching chemistry is now changed so as to etch the via pattern into the second (or trench) dielectric layer 50 until the middle stop layer 48 is reached, at which point the etching is designed to stop. A suitable etch chemistry is $C_4F_8$. The etching chemistry is then changed again to remove the middle stop layer 48 under the via pattern until the via dielectric layer 46 is exposed, as depicted in FIG. 3D.

At this point in the process, the via photoresist pattern 56 is removed using conventional oxygen ashing and/or solvents. These methods are designed so as not to remove the hard mask layer 52 or attack any of the dielectric or stop layers. The structure is then exposed to an anisotropic dry etch chemistry which etches all exposed trench dielectric and via dielectric material but not that under the hard mask layer 52, the middle stop layer 48 or the bottom stop layer 44, as depicted in FIG. 3E. This defines the trenches and vias at the same time, as depicted in FIG. 3F.

The etching chemistry is then changed to remove the hard mask layer 52, and the bottom stop layer 44 using an anisotropic dry etch such as $CF_4$ designed not to substantially attack the trench and via dielectric layers 50 and 46 and the conductor 42. Any exposed part of the middle stop layer 48 is also removed at the same time, if it is of a similar material as the bottom stop layer 44 and the hard mask layer 52. This leaves the structure with trench 70 and via 60 depicted in FIG. 3G.

Figure 2:
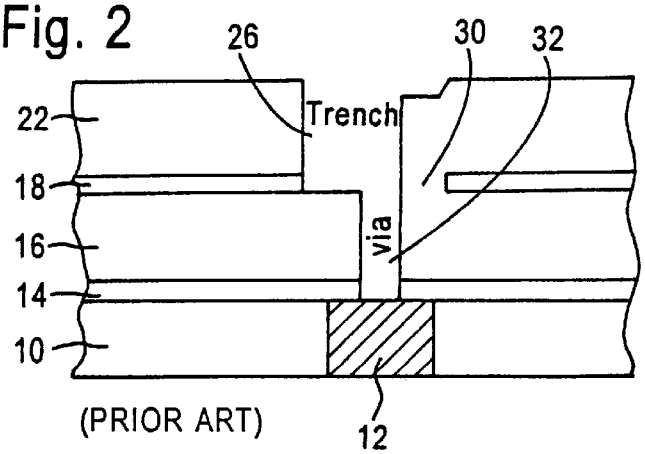
FIG. 2 is a cross-sectional view of an exemplary dual damascene trench and via formation when the borderless via has been misaligned in accordance with prior art methods of processing.

A barrier metal layer and a conductive material can be deposited in the via and trench that have been formed; After planarization, for example, the complete structure is as depicted in FIG. 3H with metal line 72 and metal stud 62. In contrast to the structure depicted in FIG. 2, the via 60 in FIG. 3G has the same width as the original via opening 58 in the via photoresist 56 and has therefore not been narrowed. At the same time, the trench 70 that has been formed completely overlaps the via 60 that has been created. This is true even though the via has been misaligned as allowed by the borderless via misalignment allowance. In this case, where the via was misaligned, the trench was widened beyond its original patterning, rather than narrowing the via. Since the via has maintained its originally intended size, there is no increase in the via resistance and it is not difficult to achieve desired barrier metal step coverage and void-free conductor filling.

In certain embodiments, the bottom stop layer 44 is omitted. In these embodiments the preexisting conductor 42 does not need to be protected from oxidation or corrosion during the dry etching steps.

Figure 4A:
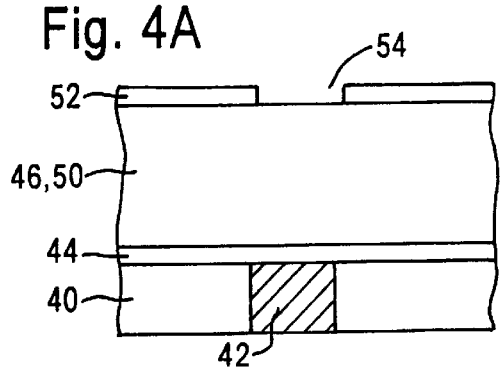
FIGS. 4A–4H depict cross-sectional views of the interconnect portion of a semiconductor wafer during a manufacturing process thereof to form a dual damascene structure with a trench and via formation in accordance with alternative embodiments of the present invention.
Figure 4B:
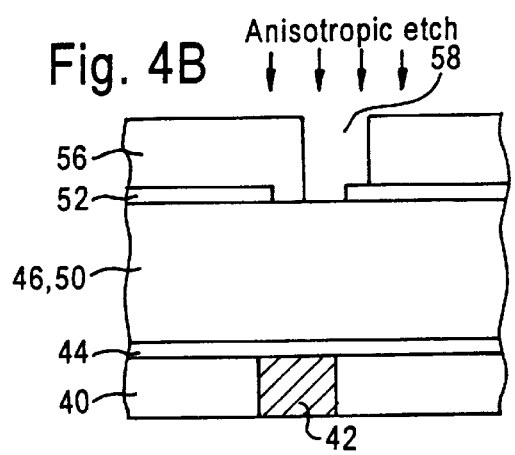
Figure 4C:
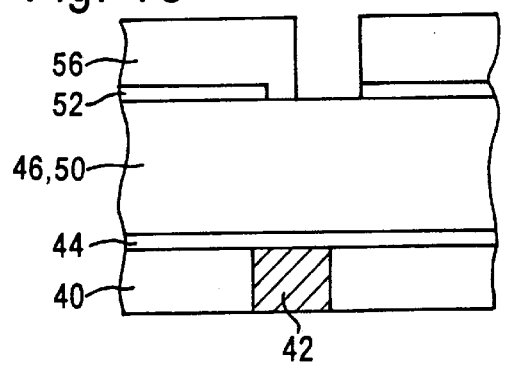
Figure 4D:
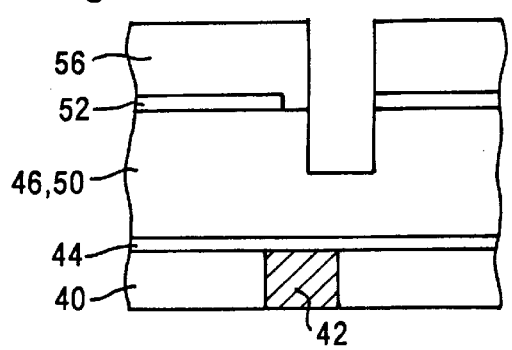
Figure 4E:
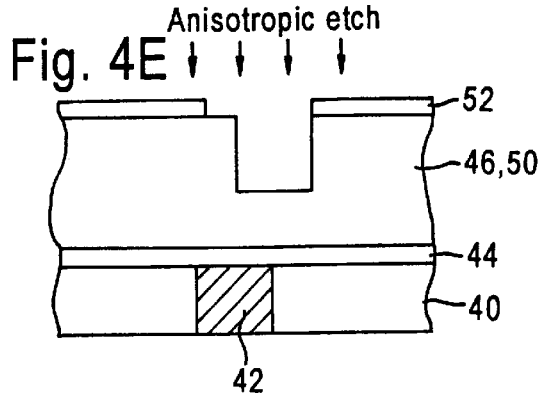
Figure 4F:
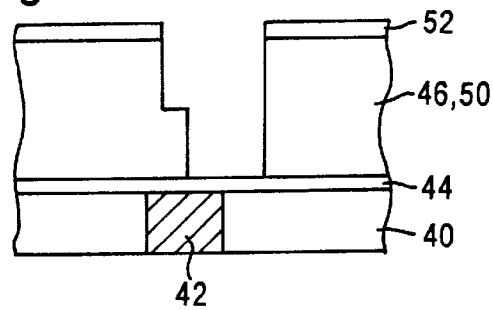

FIGS. 4A–H depict another embodiment of the present invention which is similar to that depicted in FIGS. 3A–H but does not use a middle stop layer 48 (a buried "stop layer"). This embodiment may be employed if the trench and via dielectric layers 50 and 46 are of the same material such as silicon dioxide and the etching is very well controlled by time. The middle stop layer 48 is typically silicon nitride or silicon oxynitride that has a high dielectric constant. Therefore, eliminating the middle stop layer 48 results in a reduction of the interconnect capacitance. Another advantage of the embodiments of FIGS. 4A–H is that a single etch chemistry may be used from the structure depicted in FIG. 4C until the structure in FIG. 4F is reached. A suitable etch chemistry to accomplish these steps is $C_4F_8$.

Figure 4G:
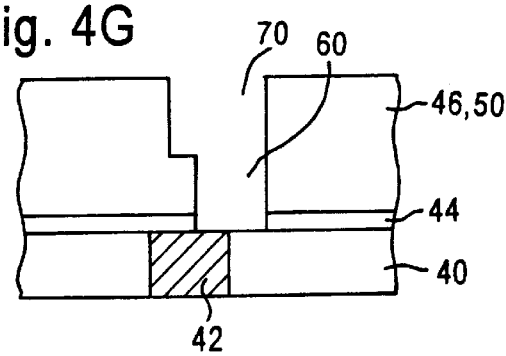
Figure 4H:
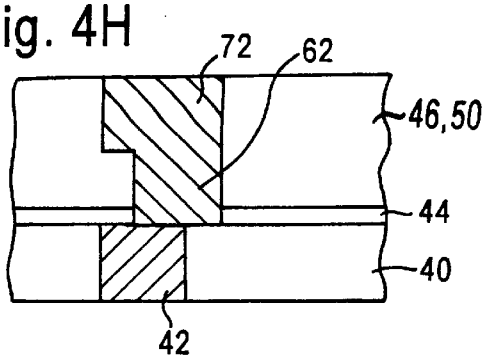

The process steps needed to arrive at the structure depicted in FIG. 4C is the same as those used to arrive at the structure in FIG. 3C. This structure (as in FIG. 4C) is exposed to an anisotropic dry etch so that the via pattern is etched into the combined trench and via dielectric (50 and 46) to a depth determined by the etch time, as depicted in FIG. 4D. The photoresist pattern 56 is then removed using conventional oxygen ashing and/or solvents, again in a manner not to remove the hardmask layer 52 or attack any of the dielectric layers. The structure is then exposed to an anisotropic dry etch chemistry which etches vertically all exposed areas of the combined trench and via dielectric (50 and 46) but does not etch the hardmask layer 52 or bottom stop layer 44, as depicted in FIG. 4E. A timed etch then defines the trenches and vias at the same time, as depicted in FIG. 4F. The process steps needed to produce the structural change from FIG. 4F to FIG. 4H are the same as those for the structural change from FIG. 3F to FIG. 3H.

In other embodiments, the middle stop layer 48 may also be omitted if the etching process used to etch the structure in FIG. 3C etches the trench dielectric material 50 but not the via dielectric material 46. In this case, the etch chemistry to be used in FIG. 3E must be able to etch both the trench dielectric 50 and the via dielectric 46 but not the hardmask layer 52 and the bottom stop layer 44.

The present invention provides a dual damascene process sequence that achieves a complete overlap of trenches with underlying borderless vias in spite of overlay errors between trench and via alignment. It also allows a via size to be independent of overlay errors while permitting borderless vias and providing complete overlap between trenches with the underlying vias.

Although the present invention has been described and illustrated in detail, it is to be clearly understood that the same is by way of illustration and example only and is not to be taken by way of limitation, the present invention being limited only by the terms of the appended claims.

What is claimed is:

1. A method of forming a dual damascene structure in a semiconductor device, comprising the steps of:
    etching a trench pattern in a mask layer that overlays a dielectric layer;
    depositing photoresist material on the mask layer after etching the trench pattern;
    patterning a via pattern in the photoresist material;
    etching the mask layer further in accordance with the via pattern;
    initially etching the dielectric layer to an approximate first predetermined depth through the mask layer in accordance with the via pattern in the photoresist material;
    removing the photoresist material on the mask layer; and
    etching the dielectric layer in accordance with the trench pattern etched in the mask layer to an approximate second predetermined depth and further etching the dielectric layer initially etched to the approximate first predetermined depth to an approximate third predetermined depth in accordance with the via pattern.

2. The method of claim 1, wherein the dielectric layer directly overlays a bottom stop layer, and the approximate third predetermined depth is a depth from a top surface of the dielectric layer to a top surface of the bottom stop layer.

3. The method of claim 2, further comprising etching the bottom stop layer in accordance with the via pattern etched in the dielectric layer.

4. The method of claim 1, wherein the dielectric layer comprises a via dielectric layer and a trench dielectric layer, and an intermediate stop layer directly overlays the via dielectric layer and the trench dielectric layer directly overlays the intermediate stop layer, and wherein the step of initially etching the dielectric layer to an approximate first predetermined depth includes etching the trench dielectric layer to the intermediate stop layer.

5. The method of claim 4, further comprising removing the intermediate stop layer in accordance with the via pattern.

6. The method of claim 5, wherein the step of etching the dielectric layer in accordance with the trench pattern etched in the mask layer to an approximate second predetermined depth includes etching the trench dielectric layer to the intermediate stop layer.

7. The method of claim 6, wherein the step of further etching the dielectric layer initially etched to the approximate first predetermined depth to an approximate third predetermined depth in accordance with the via pattern includes etching the via dielectric layer in accordance with the via pattern.

8. The method of claim 7, wherein the trench dielectric layer and the via dielectric layer have substantially different etch characteristics than the mask layer, the intermediate stop layer and the bottom stop layer such that the mask layer, the intermediate stop layer and the bottom stop layer are not substantially etched during etching of the trench dielectric layer and the via dielectric layer, and the trench dielectric layer and the via dielectric layer are not substantially etched during etching of the mask layer, the intermediate stop layer and the bottom stop layer.

9. The method of claim 1, wherein the step of patterning a via pattern in the photoresist material includes allowing alignment of the via pattern with respect to the trench pattern such that a portion of the via pattern is possibly outside of the trench pattern.

10. A method of forming a dual damascene structure in an arrangement having a dielectric layer and a mask layer formed over the dielectric layer, the method comprising the steps of:
    creating a trench pattern in the mask layer, the trench pattern having a first width;
    aligning a via pattern over the mask layer, with at least a portion of the via pattern overlapping the trench pattern;
    removing any portion of the mask layer within the via pattern that does not overlap the trench pattern to widen the trench pattern to a second width greater than the first width when the via pattern does not completely overlap the trench pattern;
    etching the dielectric layer according to the via pattern to create a via opening with a first depth; and
    etching the via opening in the dielectric layer further according to the via pattern to a second depth and simultaneously etching the dielectric layer according to the trench pattern in the mask layer to a third depth.

11. The method of claim 10, wherein the dielectric layer directly overlays a bottom stop layer, and the second depth is a depth from a top surface of the dielectric layer to a top surface of the bottom stop layer.

12. The method of claim 11, further comprising etching the bottom stop layer in accordance with the via opening created in the dielectric layer.

13. The method of claim 10, wherein the dielectric layer comprises a via dielectric layer and a trench dielectric layer, and an intermediate stop layer directly overlays the via dielectric layer and the trench dielectric layer directly overlays the intermediate stop layer, and wherein the step of initially etching the dielectric layer to a first depth includes etching the trench dielectric layer to the intermediate stop layer.

14. The method of claim 13, further comprising removing the intermediate stop layer in accordance with the via opening.

15. The method of claim 14, wherein the step of etching the dielectric layer in accordance with the trench pattern etched in the mask layer to a third depth includes etching the trench dielectric layer to the intermediate stop layer.

16. The method of claim 15, wherein the step of further etching the dielectric layer initially etched to a first depth to a second depth in accordance with the via pattern includes etching the via dielectric layer in accordance with the via pattern.

17. The method of claim 15, wherein the trench dielectric layer and the via dielectric layer have substantially different etch characteristics than the mask layer, the intermediate stop layer and the bottom stop layer such that the mask layer, the intermediate stop layer and the bottom stop layer are not substantially etched during etching of the trench dielectric layer and the via dielectric layer, and the trench dielectric layer and the via dielectric layer are not substantially etched during etching of the mask layer, the intermediate stop layer and the bottom stop layer.

18. The method of claim 10, wherein the step of patterning a via pattern in the photoresist material includes allowing alignment of the via pattern with respect to the trench pattern such that a portion of the via pattern is possibly outside of the trench pattern.

19. The method of claim 1, wherein the dielectric layer comprises a via dielectric layer and a trench dielectric layer that directly overlays the via dielectric layer, and wherein the first predetermined depth is equal to a depth of the trench dielectric layer and the third predetermined depth is equal to the combined depth of the trench dielectric layer and the via dielectric layer.

20. The method of claim 19, wherein the initial etching of the dielectric layer includes etching the trench dielectric layer with an etchant chemistry that will not etch the via dielectric layer.

21. The method of claim 20, wherein the steps of the etching of the dielectric layer in accordance with the trench pattern etched in the mask layer and further etching the dielectric layer includes etching the trench dielectric layer and the via dielectric layer with a single etchant chemistry that etches both the via and trench dielectric layers.

* * * * *